United States Patent
Yang et al.

(10) Patent No.: US 12,044,716 B2
(45) Date of Patent: Jul. 23, 2024

(54) CAPACITANCE MEASUREMENT METHOD, SYSTEM AND APPARATUS, ELECTRONIC DEVICE, AND STORAGE MEDIUM

(71) Applicant: CHANGXIN MEMORY TECHNOLOGIES, INC., Hefei (CN)

(72) Inventors: Bo Yang, Hefei (CN); Qian Xu, Hefei (CN); Xinyu Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 262 days.

(21) Appl. No.: 17/852,895

(22) Filed: Jun. 29, 2022

(65) Prior Publication Data

US 2023/0305046 A1   Sep. 28, 2023

Related U.S. Application Data

(63) Continuation of application No. PCT/CN2022/086800, filed on Apr. 14, 2022.

(30) Foreign Application Priority Data

Mar. 23, 2022  (CN) .................. 202210291405.X

(51) Int. Cl.
G01R 27/26  (2006.01)
G01D 5/24   (2006.01)
G01R 35/00  (2006.01)

(52) U.S. Cl.
CPC ......... *G01R 27/2605* (2013.01); *G01D 5/24* (2013.01); *G01R 35/005* (2013.01)

(58) Field of Classification Search
CPC ........ G01R 27/00; G01R 27/02; G01R 27/26; G01R 27/2605; G01R 35/00;
(Continued)

(56) References Cited

U.S. PATENT DOCUMENTS 7,023,220 B2 * 4/2006 Pelz .................. G01R 27/2605
324/684
7,230,435 B2 * 6/2007 Kunikiyo ........... G01R 27/2605
324/663

(Continued)

FOREIGN PATENT DOCUMENTS

CN       203133129 U  *  8/2013  ............. G01R 1/073
CN       111933546      11/2020
(Continued)

*Primary Examiner* — Hoai-An D. Nguyen
(74) *Attorney, Agent, or Firm* — Syncoda LLC; Feng Ma

(57) ABSTRACT

Embodiments of the disclosure provide a capacitance measurement method, system and apparatus, an electronic device, and a storage medium. The method is applied to a machine table and includes: obtaining a calibration file including multiple first capacitance values corresponding to a measurement probe card while the measurement probe card is floating; measuring, by the measurement probe card, multiple semiconductor devices simultaneously to obtain multiple second capacitance values corresponding to the multiple semiconductor devices, the multiple semiconductor devices being located on a same test module of a semiconductor chip; and determining target capacitance values of the multiple semiconductor devices based on the multiple first capacitance values and the multiple second capacitance values.

20 Claims, 10 Drawing Sheets

A calibration file is obtained. The calibration file includes multiple first capacitance values corresponding to a measurement probe card while the measurement probe card is floating — S11

Multiple semiconductor devices are simultaneously measured by the measurement probe card to obtain multiple second capacitance values corresponding to the multiple semiconductor devices. The multiple semiconductor devices are located on a same test module of a semiconductor chip — S12

Target capacitance values of the multiple semiconductor devices are determined based on the multiple first capacitance values and the multiple second capacitance values — S13

(58) Field of Classification Search
CPC .......... G01R 35/005; G01D 5/00; G01D 5/12;
G01D 5/14; G01D 5/24
USPC .................. 324/600, 649, 658, 661, 662
See application file for complete search history.

(56) References Cited

U.S. PATENT DOCUMENTS

| | | | |
|---|---|---|---|
| 9,921,267 B2* | 3/2018 | Kang | G01R 31/2891 |
| 2013/0006557 A1* | 1/2013 | Chakrabarty | G01R 31/318541 |
| | | | 702/65 |
| 2017/0336451 A1* | 11/2017 | Chen | G01R 1/07314 |
| 2019/0120924 A1* | 4/2019 | Hou | G01R 35/005 |

FOREIGN PATENT DOCUMENTS

| | | | | | |
|---|---|---|---|---|---|
| JP | 2008026122 A | * | 2/2008 | ............. | G01R 1/073 |
| JP | 2016151573 A | * | 8/2016 | ........... | G01R 1/0675 |
| JP | 2022091532 A | * | 6/2022 | ............. | G01R 31/64 |

* cited by examiner

CAPACITANCE MEASUREMENT METHOD, SYSTEM AND APPARATUS, ELECTRONIC DEVICE, AND STORAGE MEDIUM

CROSS-REFERENCE TO RELATED APPLICATIONS

This application is a continuation of International Application No. PCT/CN2022/086800, filed on Apr. 14, 2022, which claims priority to Chinese patent application 202210291405.X, filed on Mar. 23, 2022 and entitled "CAPACITANCE MEASUREMENT METHOD, SYSTEM AND APPARATUS, ELECTRONIC DEVICE, AND STORAGE MEDIUM". The contents of International Application No. PCT/CN2022/086800 and Chinese patent application 202210291405.X are hereby incorporated by reference in their entireties.

BACKGROUND

Capacitors are very important structures in semiconductor manufacturing processes, especially in the field of memory manufacturing. Fast and accurate capacitance measurement is of great practical significance to improving process quality, saving test time and improving production capacity. In the related art, a Wafer Acceptance Test (WAT) capacitance measurement method costs long time, is inefficient and has low accuracy.

SUMMARY

The disclosure relates to, but is not limited to, the field of semiconductor testing, and in particular to a capacitance measurement method, system and apparatus and a non-transitory computer-readable storage medium.

Embodiment of the disclosure provide a capacitance measurement method, applied to a machine table and including: obtaining a calibration file, wherein the calibration file includes multiple first capacitance values corresponding to a measurement probe card while the measurement probe card is floating; measuring, by the measurement probe card, multiple semiconductor devices simultaneously to obtain multiple second capacitance values corresponding to the multiple semiconductor devices, the multiple semiconductor devices being located on a same test module of a semiconductor chip; and determining target capacitance values of the multiple semiconductor devices based on the multiple first capacitance values and the multiple second capacitance values.

Embodiments of the disclosure provide a measurement system, including: a measurement component including a measurement probe card and a measurement circuit, wherein the measurement circuit is configured to use the measurement probe card to measure multiple semiconductor devices to obtain a second capacitance value of each of the multiple semiconductor devices; and a processor, configured to: obtain a calibration file, wherein the calibration file includes multiple first capacitance values corresponding to the measurement probe card while the measurement probe card is floating; control the measurement circuit to measure, by the measurement probe card, the multiple semiconductor devices simultaneously to obtain multiple second capacitance values corresponding to the multiple semiconductor devices, wherein the multiple semiconductor devices are located on a same test module of a semiconductor chip; and determine target capacitance values of the multiple semiconductor devices based on the multiple first capacitance values and the multiple second capacitance values.

Embodiments of the disclosure provides a capacitance measurement apparatus, applied to a machine table and including a processor and a memory having stored thereon a computer program executable on the processor, wherein the processor, when executing the computer program, implements a capacitance measurement method, the method including: obtaining a calibration file, wherein the calibration file includes first capacitance values corresponding to a measurement probe card while the measurement probe card is floating; measuring, by the measurement probe card, multiple semiconductor devices simultaneously to obtain multiple second capacitance values corresponding to the multiple semiconductor devices, the multiple semiconductor devices being located on a same test module of a semiconductor chip; and determining target capacitance values of the multiple semiconductor devices based on the multiple first capacitance values and the multiple second capacitance values.

Embodiments of the disclosure provide a non-transitory computer-readable storage medium having stored thereon a computer program that, when executed by a processor, implements the above method.

DETAILED DESCRIPTION

Figure 1:
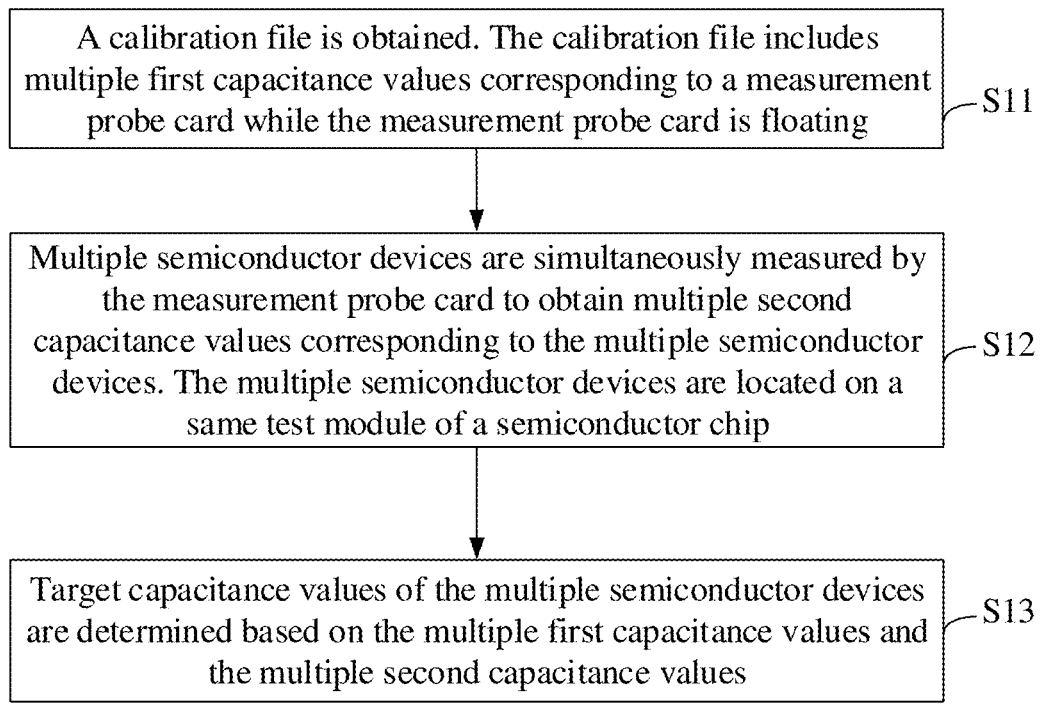
FIG. 1 illustrates a schematic implementation flowchart of a capacitance measurement method according to embodiments of the disclosure.

For making the objectives, technical solutions, and advantages of the disclosure clearer, the technical solutions of the disclosure will further be described below in combination with the drawings and embodiments in detail. The described embodiments should not be considered as limitation to the disclosure. All other embodiments obtained by those of ordinary skill in the art without creative work shall fall within the scope of protection of the disclosure.

"Some embodiments" involved in the following descriptions describes a subset of all possible embodiments. However, it can be understood that "some embodiments" may be the same subset or different subsets of all the possible embodiments, and may be combined without conflicts. If the similar descriptions of "first/second" appear in the application documents, the following descriptions will be added: term "first/second/third" involved in the following descriptions is only for distinguishing similar objects and does not represent a specific sequence of the objects. It can be understood that "first/second/third" may be interchanged to specific sequences or orders if allowed, so as to implement the embodiments of the disclosure described herein in sequences except the illustrated or described ones.

Unless otherwise defined, all technological and scientific terms used in the disclosure have meanings the same as those usually understood by those skilled in the art of the disclosure. The terms used in the disclosure are only adopted to describe the embodiments of the disclosure and not intended to limit the disclosure.

In order to better understand a capacitance measurement method provided in the embodiment of the disclosure, the problems existing in capacitance measurement of a test machine in the related art are described below.

In the related art, there are many factors affecting the capacitance measurement accuracy. Herein, the parasitic capacitance of a measurement probe card has a great influence on the capacitance measurement. In the process of measuring capacitance in the related art, in order to obtain an actual capacitance measurement result, an empty pin capacitance value Coff while the measurement probe card is floating needs to be subtracted from a measured capacitance value Cm of a Device Under Test (DUT), so as to obtain an actual capacitance value Cdut.

According to a Wafer Acceptance Test (WAT) capacitance measurement method in the related art, each time a capacitance measurement item (for example, a capacitance value) is performed, the empty pin capacitance Coff while the measurement probe card is floating (that is, probe up) needs to be firstly tested, and then the capacitance value Cm while the measurement probe card is connected to a semiconductor device (that is, probe down) is measured; thus the actual value Cdut is obtained finally. When a test module involves multiple capacitance measurement items, continuous probe up and down are needed, which may lead to two disadvantages: 1, the test speed may be affected by continuous probe up and down; 2, the cleanliness of the probe card may be affected by continuous probe down and contact with a metal pad of the measurement item, influencing the accuracy of test results.

Embodiments of the disclosure provide a capacitance measurement method, in which a first capacitance value may be read from a calibration file. The first capacitance value refers to an empty pin capacitance between multiple measurement pins when the measurement probe card is floating. There is no need for repetitively measuring the first capacitance value. On the one hand, the probe down frequency of the measurement probe card can be reduced, reducing the measurement time of the semiconductor device and improving the measurement efficiency. On the other hand, the number of times that the probe card contacts the metal pad of the measurement item can be reduced, reducing the dirty loss of the measurement probe card and improving the accuracy of measurement results. The method may be executed by an electronic device. Herein, the electronic device may be any suitable device having data handling capacity, such as a server, a laptop, a tablet, a desktop computer, a smart television, a set-top box, a machine table or a mobile device (for example, a mobile phone, a portable video player, a personal digital assistant, a dedicated message device, and a portable game device). The server may be an independent physical server, may be a server cluster or distributed system formed by multiple physical servers, or may be a cloud server configured to provide basic cloud computing services such as a cloud service, a cloud database, cloud computing, a cloud function, cloud storage, a network service, cloud communication, a middleware service, a domain name service, a security service, a Content Delivery Network (CDN), and a big data and artificial intelligence platform.

The technical solutions in the embodiments of the disclosure will be clearly and completely described below in combination with the drawings in the embodiments of the disclosure.

FIG. 1 illustrates a schematic implementation flowchart of a capacitance measurement method according to embodiments of the disclosure. As illustrated in FIG. 1, the method is applied to a machine table and includes following S11 to S13.

At S11, a calibration file is obtained. The calibration file includes multiple first capacitance values corresponding to a measurement probe card while the measurement probe card is floating.

Here, the measurement probe card includes at least two measurement pins, and the calibration file includes first capacitance values corresponding to multiple measurement pins while the multiple pins are floating. The first capacitance value is configured to represent an empty pin capacitance value when measurement pins are floating.

In some implementations, the calibration file may be pre-stored in the machine table, or in other electronic devices other than the machine table. Then, the calibration file may be obtained directly from the machine table. Alternatively, the machine table may measure the measurement probe card by a first measurement algorithm to obtain the first capacitance values, stores the first capacitance values as the calibration file and sends the calibration file to other electronic devices, and the machine table may obtain the calibration file from the other electronic devices. Alternatively, he machine table measures, by the first measurement algorithm, the measurement probe card to obtain the first capacitance values and sends the first capacitance values to other electronic devices, and the other electronic devices store the first capacitance values in the calibration file; thus the machine table can obtain the calibration file from the other electronic devices.

At S12, multiple semiconductor devices are simultaneously measured by the measurement probe card to obtain multiple second capacitance values corresponding to the multiple semiconductor devices. Herein, the multiple semiconductor devices are located on a same test module of a semiconductor chip.

Here, the multiple semiconductor devices may be at least one semiconductor device. The semiconductor device may include, but not limited to, a capacitor, a transistor, or the like. In some implementations, the semiconductor device may be a device of a semiconductor chip. During implementation, the semiconductor chip may include one of at least one chip obtained from one wafer in a single batch of wafers, or may include one of at least one chip obtained from different wafers in a single batch of wafers, which is not limited in the embodiments of the disclosure.

In some implementations, the number of wafers in a single batch is used to represent the number of wafers that can be processed by the machine table this time. During implementation, the number of wafers in a single batch may be the maximum number of wafers processed by the machine table in a single batch. Herein, the maximum number of wafers processed in a single batch is used to represent the maximum value of the number of wafers that can be processed by the machine table at a time, and may be preset or obtained by machine learning. For example, if the maximum number of wafers processed in the single batch is 25, the number of wafers in a single batch may be 25.

The number of wafers in a single batch may also be set based on the maximum number of wafers processed in a single batch and the number of remaining wafers. For example, if the maximum number of wafers processed in a single batch is 25, and the number of remaining wafers is 30, at this time, the number of wafers in a single batch is 25. For another example, if the maximum number of wafers processed in a single batch is 25, and the number of remaining wafers is 15, at this time, the number of wafers in a single batch is 15.

In some implementations, when the at least one semiconductor device of the at least one chip of at least one wafer in the single batch of wafers is measured, the first capacitance value corresponding to the measurement probe card while the measurement probe card is floating may be obtained from the calibration file.

A test module may include a measurement structure for measuring the at least one semiconductor device. For example, the test module includes a measurement structure for five capacitors. For another example, the test module includes a measurement structure for two capacitors and a measurement structure for four transistors.

During implementation, at least one test key is arranged around each semiconductor chip to be measured of each wafer. These test keys are formed on a cutting channel between the semiconductor chips, and are connected with external components, internal components and test components through a metal welding pad of the test keys. The test key of one test module is selected, and the measurement pin of the measurement probe card is inserted into the metal pad of the test key to measure the electrical properties of at least one semiconductor device.

In some implementations, when the semiconductor device is measured, the pins of the measurement probe card are connected with measurement ports of the semiconductor device respectively. During implementation, the number of pins of the measurement probe card that are to be correspondingly used during measurement may be determined according to the number of ports of the semiconductor device. For example, a couple of measurement pins in the measurement probe card are used in measuring the capacitor. For another example, four measurement pins in the measurement probe card may be used in measuring the capacitance value of the transistor.

In a process of measuring multiple semiconductor devices, the measurement probe card may measure at least one semiconductor device simultaneously. During implementation, each of the multiple semiconductor devices may be separately measured with one semiconductor device as a unit, and the second capacitance value of the semiconductor device may be obtained at each measurement. The at least one semiconductor device may also be simultaneously measured with at least one semiconductor device as a unit, and the second capacitance value of each semiconductor device may be obtained at each measurement.

At S13, target capacitance values of the multiple semiconductor devices are determined based on the multiple first capacitance values and the multiple second capacitance values.

Here, the target capacitance value may include, but not limited to, a difference value between the second capacitance value and the first capacitance value, a difference value between the weighted second capacitance value and the weighted first capacitance value, and the like. During implementation, those skilled in the art may determine a manner of determining the target capacitance value according to the actual requirements, which is not limited in the embodiments of the disclosure.

In embodiments of the disclosure, the first capacitance values corresponding to the measurement probe card while the measurement probe card is floating are obtained by the calibration file, the second capacitance values of the semiconductor devices are measured by the measurement probe card, and the target capacitance values of the semiconductor devices can be obtained based on the first capacitance values and the second capacitance values. In this way, the first capacitance values are read directly from the calibration file, without the need for measuring the first capacitance values through frequent probe-down of the measurement probe card. On the one hand, the probe-down frequency of the measurement probe card can be reduced, the measurement time of the semiconductor devices can be saved and the measurement efficiency can be improved. On the other hand, the number of contact times between the measurement probe card and the metal pad of the measurement item can be reduced, reducing the dirty loss of the measurement probe card, and improving the accuracy of the measurement results.

Figure 2:
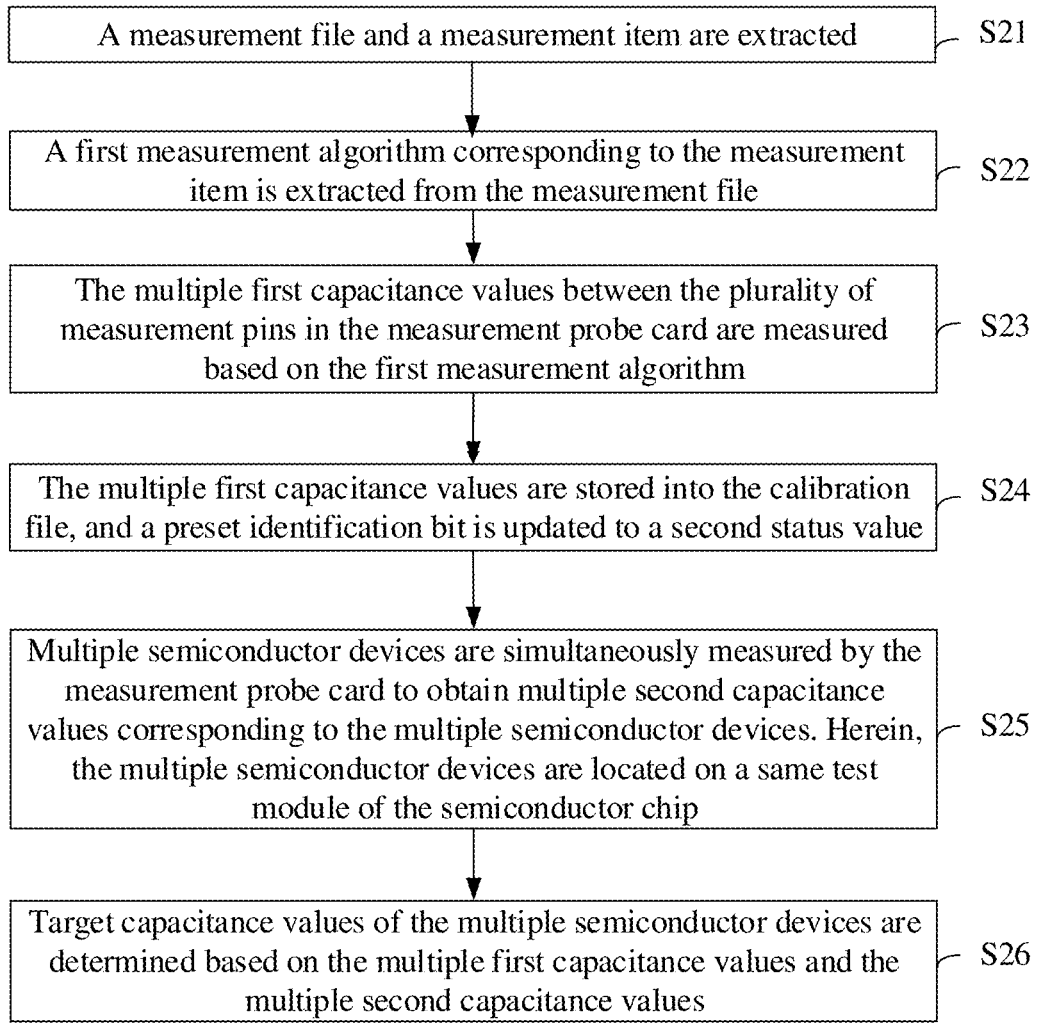
FIG. 2 illustrates a schematic implementation flowchart of a capacitance measurement method according to embodiments of the disclosure.

FIG. 2 illustrates a schematic implementation flowchart of a capacitance measurement method according to embodiments of the disclosure. As illustrated in FIG. 2, the method is applied to a machine table and includes following S21 to S26.

At S21, a measurement file and a measurement item are extracted.

Here, the measurement file represents a description file about measurement of at least one measurement item. The measurement file may include, but not limited to, a measurement item, a measurement method, a measurement time, and the like. During implementation, the measurement file may be pre-written by an operator.

Before measurement is performed by the machine table, the measurement file may be pre-stored in the machine table, or may be stored in other electronic devices. Then, during measurement, the measurement file may be obtained directly from the machine table, or may be obtained from the other electronic devices.

The measurement item may include, but not limited to, measurement of a semiconductor device. For example, the measurement item may be measurement of a capacitance value of a capacitor. For another example, the measurement item may be measurement of a capacitance value of a transistor.

At S22, a first measurement algorithm corresponding to the measurement item is extracted from the measurement file.

Here, different measurement items may correspond to a same algorithm or different measurement algorithms. For example, when the capacitance of a capacitor is measured, a capacitor capacitance measurement algorithm is adopted. For another example, when the capacitance of a transistor is measured, a transistor capacitance measurement algorithm is adopted. During implementation, the capacitance measurement algorithm may be a measurement algorithm often used in the field or an algorithm with improvement made based on the measurement algorithm often used in the field, which is not limited in the embodiments of the disclosure.

In some implementations, the first measurement algorithm includes a capacitance measurement algorithm. Herein, the capacitance measurement algorithm includes measuring a charge value and a voltage value and obtaining a capacitance value based on the measured charge value and voltage value.

At S23, the multiple first capacitance values between the multiple measurement pins in the measurement probe card are measured based on the first measurement algorithm.

Here, the multiple measurement pins include at least one measurement pin.

In some implementations, when the measurement item is measured, the pins of the measurement probe card are connected to ports used by the measurement item respectively. During implementation, the number of pins of the measurement probe card that are to be used during measurement may be determined according to the number of ports used in the measurement item. For example, a couple of measurement pins in the measurement probe card are used in measuring the capacitor. For another example, four measurement pins in the measurement probe card may be used in measuring the capacitance value of the transistor.

In some implementations, the at least one measurement port used in the measurement of all the measurement items may be obtained from the measurement file, and at least one measurement pin may be determined based on each measurement port.

In some implementations, S23 includes S231 to S233.

At S231, measurement ports of the multiple semiconductor devices are determined based on the measurement file.

Here, the measurement file may include measurement ports for use in measuring at least one semiconductor device and the measurement port for use in measuring each semiconductor device.

For example, the measurement file includes a measurement item for a capacitance value of a capacitor 1 and a measurement item for a capacitance value of a capacitor 2. Herein, in the measurement item for the capacitor 1, a measurement pin a of the measurement probe card is to be connected with a measurement port A1 of the capacitor 1, and a measurement pin b of the measurement probe card is to be connected with a measurement port B1 of the capacitor 1. In the measurement item for the capacitor 2, a measurement pin d of the measurement probe card is to be connected with a measurement port A2 of the capacitor 2, and a measurement pin e of the measurement probe card is to be connected with a measurement port B2 of the capacitor 2. Then, the measurement ports of the multiple semiconductor devices include the measurement port A1, the measurement port B1, the measurement port A2 and the measurement port B2. Herein, the measurement ports A1 and B1 may be upper and lower plates of the capacitor 1 respectively, and the measurement ports A2 and B2 may be upper and lower plates of the capacitor 2 respectively.

For another example, the measurement file includes a measurement item for a capacitance value of a capacitor 3 and a measurement item for a capacitance value of a transistor 4. Herein, in the measurement item for the capacitor 3, the measurement pin a of the measurement probe card is to be connected with a measurement port A3 of the capacitor 3, and the measurement pin b of the measurement probe card is to be connected with a measurement port B3 of the capacitor 3. In measurement item for the capacitor 4, the measurement pin d of the measurement probe card is to be connected with a measurement port A4 of the transistor 4, the measurement pin e of the measurement probe card is to be connected with a measurement port B4 of the transistor 4, a measurement pin f of the measurement probe card is to be connected with a measurement port C4 of the transistor 4, and a measurement pin g of the measurement probe card is to be connected with a measurement port D4 of the transistor 4. Then, the measurement ports of the multiple semiconductor devices include the measurement port A3, the measurement port B3, the measurement port A4, the measurement port B4, the measurement port C4 and the measurement port D4. Herein, the measurement ports A3 and B3 may be upper and lower plates of the capacitor 3 respectively, and the measurement ports A4 to D4 may be a source, a grid, a drain and a substrate of the transistor 4 respectively.

At S232, based on each of the measurement ports, a respective measurement pin is determined.

Here, based on the corresponding relationships between the measurement ports and the measurement pins, the measurement pins to be used for all the measurement items in the measurement file can be determined.

For example, the measurement port A1 and the measurement port B1 are connected with the measurement pin a and the measurement pin b respectively, and the measurement port A2 and the measurement port B2 are connected with the measurement pin d and measurement pin e respectively, so that it can be determined that the multiple measurement pins include the measurement pin a, the measurement pin b, the measurement pin d and the measurement pin e. At this time, the first capacitance value between the measurement pin a and the measurement pin b, and the first capacitance value between the measurement pin d and the measurement pin e may be measured by use of the first measurement algorithm.

At S233, the multiple first capacitance values between the multiple measurement pins, each of which is floating, are obtained based on the first measurement algorithm.

Here, when the measurement probe card is floating, the first capacitance values between the multiple measurement pins are measured based on the first measurement algorithm. For example, the multiple measurement pins include a first pair of measurement pins and a second pair of measurement pins. Herein, the first pair of measurement pins includes the measurement pin a and the measurement pin b, and the second pair of measurement pins includes the measurement pin d and the measurement pin e. Thus, when the measurement probe card is floating, the first capacitance value between the measurement pin a and measurement pin b, and the first capacitance value between the measurement pin d and the measurement pin e are measured based on the first measurement algorithm.

In some implementations, the multiple measurement pins include multiple measurement pin groups. Each measurement pin group includes a first pin and a second pin. S233 includes S2331 to S2333.

At S2331, for each measurement pin group, a quantity of electric charges between the first pin and the second pin is determined.

At S2332, a voltage difference between the first pin and the second pin is determined.

At S2333, a first capacitance value of the measurement pin group is determined based on the quantity of electric charges and the voltage difference.

Here, the first capacitance value may be a ratio of the quantity of electric charges to the voltage difference, or a ratio of the weighted quantity of electric charges to the weighted voltage difference. During implementation, those skilled in the art may determine a manner of determining the first capacitance value according to the actual requirements, which is not limited in the embodiments of the disclosure.

At S24, the multiple first capacitance values are stored into the calibration file, and a preset identification bit is updated to a second status value.

Here, the calibration file may be pre-stored in the machine table, or in other electronic devices. Then, when the calibration file is stored into the machine table, each first capacitance value is stored into the calibration file. When the calibration file is stored into other electronic devices, each first capacitance value is sent to the other electronic devices, so that the other electronic devices store the first capacitance value into the calibration file.

The identification bit is used to indicate whether a calibration file exists currently. When the identification bit is the second status value, it indicates that a calibration file exists currently. When the identification bit is a first status value, it indicates that no calibration file exists currently.

In some implementations, when at least one wafer in the same batch is measured, the first capacitance values corresponding to the measurement probe card while the measurement probe card is floating are obtained by use of the same calibration file.

In some implementations, S24 includes S241 to S242.

At S241, for each of the multiple first capacitance values, capacitance identification information of the first capacitance value is determined based on identification information of the first pin and identification information of the second pin by which the first capacitance value is measured.

Here, each pin of the measurement probe card has identification information. Herein, the identification information includes but not limited to an index value, a serial number, a sign, a number, and the like.

In some implementations, the capacitance identification information may include the identification information of the first pin and the identification information of the second pin. For example, if the identification information of the first pin is 11 and the identification information of the second pin is 12, the capacitance identification information may be 1112. For another example, if the identification information of the first pin is 11 and the identification information of the second pin is 12, the capacitance identification information may be 1211.

In some implementations, the capacitance identification information may be generated based on the identification information of the first pin, the identification information of the second pin, and a special word or special symbol. For example, if the identification information of the first pin is 11, the identification information of the second pin is 12, and the special symbol is "-", the capacitance identification information may be 11-12. For another example, if the identification information of the first pin is 11, the identification information of the second pin is 12, and the special symbol is "@", the capacitance identification information may be 12 @11.

During implementation, those skilled in the art may set the capacitance identification information independently according to the actual requirements, which is not limited in the disclosure.

At S242, each piece of the capacitance identification information and a corresponding first capacitance value are stored into the calibration file.

Here, one-to-one correspondence between the capacitance identification information and the first capacitance value may be established and stored into the calibration file.

In some implementations, before S21, the method further includes the following operations.

At S20, in response to obtaining a new batch of wafers, the preset identification bit is set to a first status value, and the calibration file is deleted. Each wafer includes at least one semiconductor chip.

Here, for a new batch of wafers, because the measurement environment may change, in order to improve the accuracy of measurement, the existing calibration file is deleted and the identification bit is set to be the first status value before the new batch of wafers are measured on the machine table.

In some implementations, a manner of deleting the calibration file may include, but not limited to, clearing the content of the calibration file, removing the calibration file, and the like.

At S25, multiple semiconductor devices are simultaneously measured by the measurement probe card to obtain multiple second capacitance values corresponding to the multiple semiconductor devices. Herein, the multiple semiconductor devices are located on a same test module of the semiconductor chip.

At S26, target capacitance values of the multiple semiconductor devices are determined based on the multiple first capacitance values and the multiple second capacitance values.

S25 to S26 correspond to S12 to S13, and may refer to the specific implementations of S12 to S13 during implementation.

In the embodiments of the disclosure, the first measurement algorithm and the multiple measurement pins are obtained from the measurement file. The multiple first capacitance values between the multiple measurement pins are obtained based on the first measurement algorithm, and the multiple first capacitance values are stored into the calibration file. In this way, a first capacitance value between corresponding measurement pins may be read directly from the calibration file when the capacitance value of the semiconductor device is measured subsequently, without the need for measuring the first capacitance value between the measurement pins through probe down again. Not only the probe down frequency of the measurement probe card can be reduced, reducing the measurement time of the semiconductor device, but also the number of contact times between the measurement probe card and the metal pad of the measurement item can be reduced, reducing the dirty loss of the measurement probe card, and improving the accuracy of the measurement results.

Figure 3:
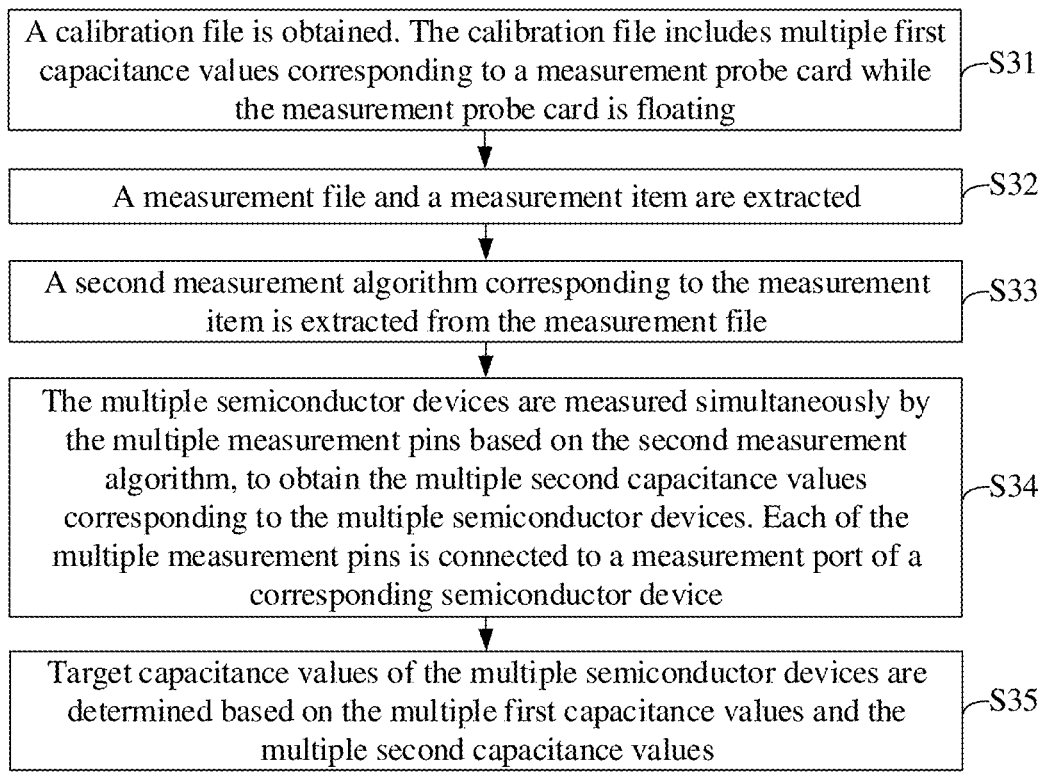
FIG. 3 illustrates a schematic implementation flowchart of a capacitance measurement method according to embodiments of the disclosure.

FIG. 3 illustrates a schematic implementation flowchart of a capacitance measurement method according to embodiments of the disclosure. As illustrated in FIG. 3, the method is applied to a machine table and includes S31 to S33.

At S31, a calibration file is obtained. The calibration file includes multiple first capacitance values corresponding to a measurement probe card while the measurement probe card is floating.

S31 corresponds to S11, and may refer to the specific implementation of S11 during implementation.

At S32, a measurement file and a measurement item are extracted.

S32 corresponds to S21, and may refer to the specific implementation of S21 during implementation.

At S33, a second measurement algorithm corresponding to the measurement item is extracted from the measurement file.

Here, different measurement items may correspond to a same algorithm or different measurement algorithms. For example, when the capacitance value of a capacitor is measured, a capacitor capacitance measurement algorithm is adopted. For another example, when the capacitance value of a transistor is measured, a transistor capacitance measurement algorithm is adopted. During implementation, the capacitance measurement algorithm may be a measurement algorithm often used in the field or an algorithm with improvement made based on the measurement algorithm often used in the field, which is not limited in the embodiments of the disclosure.

In some implementations, the second measurement algorithm includes a capacitance measurement algorithm. Herein, the capacitance measurement algorithm includes measuring a charge value and a voltage value and obtaining a capacitance value based on the measured charge value and voltage value.

At S34, the multiple semiconductor devices are measured simultaneously by the multiple measurement pins based on the second measurement algorithm, to obtain the multiple second capacitance values corresponding to the multiple semiconductor devices. Each of the multiple measurement pins is connected to a measurement port of a corresponding semiconductor device.

Here, the multiple measurement pins include at least one measurement pin.

In some implementations, when a semiconductor device is measured, the pins of the measurement probe card are connected to the used measurement ports of the semiconductor device respectively. During implementation, the number of pins of the measurement probe card that are used in the measurement may be determined according to the number of ports of the semiconductor device that are used. For example, a couple of measurement pins in the measurement probe card is used in measuring a capacitor. For another example, four measurement pins in the measurement probe card may be used in measuring the capacitance value of a transistor.

In some implementations, at least one measurement port used in measuring each of the semiconductor devices to be measured may be obtained from the measurement file, and at least one measurement pin may be determined based on each measurement port.

At S35, target capacitance values of the multiple semiconductor devices are determined based on the multiple first capacitance values and the multiple second capacitance values.

S35 corresponds to S13, and may refer to the specific implementation of S13 during implementation.

In the embodiment of the disclosure, the first capacitance values corresponding to the measurement probe card while the measurement probe card is floating are obtained by the calibration file, and the second measurement algorithm and the multiple measurement pins are obtained from the measurement file. The second capacitance values of the semiconductor devices are obtained based on the second measurement algorithm, and the target capacitance values of the semiconductor devices can be obtained based on the first capacitance values and the second capacitance values. In this way, a first capacitance value between corresponding measurement pins may be read directly from the calibration file when the capacitance value of a semiconductor device is measured subsequently, without the need for measuring the first capacitance value between the measurement pins by performing probe down again. Not only the probe down frequency of the measurement probe card can be reduced, reducing the measurement time of the semiconductor device, but also the number of contact times between the measurement probe card and the metal pad of the measurement item can be reduced, reducing the dirty loss of the measurement probe card and improving the accuracy of measurement results.

Figure 4:
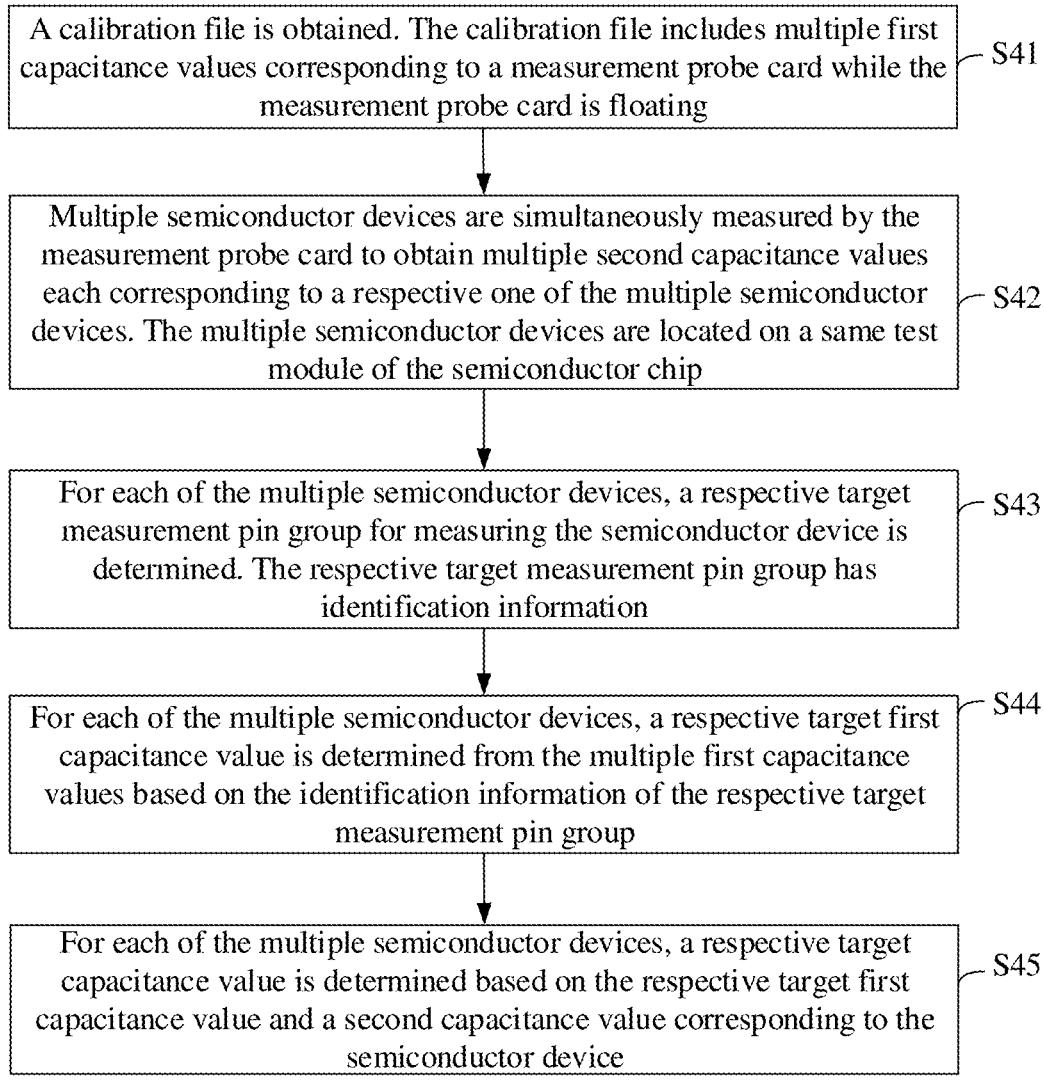
FIG. 4 illustrates a schematic implementation flowchart of a capacitance measurement method according to embodiments of the disclosure.

FIG. 4 illustrates a schematic implementation flowchart of a capacitance measurement method according to embodiments of the disclosure. As illustrated in FIG. 4, the method is applied to a machine table and includes S41 to S45.

At S41, a calibration file is obtained. The calibration file includes multiple first capacitance values corresponding to a measurement probe card while the measurement probe card is floating.

At S42, multiple semiconductor devices are simultaneously measured by the measurement probe card to obtain multiple second capacitance values each corresponding to a respective one of the multiple semiconductor devices. Herein, the multiple semiconductor devices are located on a same test module of the semiconductor chip.

S41 to S42 correspond to S11 to S12 respectively, and may refer to the specific implementations of S11 to S12 during implementation.

At S43, for each of the multiple semiconductor devices, a respective target measurement pin group for measuring the semiconductor device is determined. The respective target measurement pin group has identification information.

Here, the target measurement pin group may include, but not limited to, two measurement pins, four measurement pins, and the like.

In some implementations, at least one measurement port used in measurement of each semiconductor device may be obtained from the measurement file, and at least one target measurement pin group may be determined based on each measurement port.

At S44, for each of the multiple semiconductor devices, a respective target first capacitance value is determined from the multiple first capacitance values based on the identification information of the respective target measurement pin group.

In some implementations, the identification information of the measurement pin group and the first capacitance value between the measurement pin group are pre-stored into the calibration file, then the first capacitance value matched with the identification information of the target measurement pin group may be obtained from the calibration file. For example, 1112-10 picofarad (pF), 1314-6 pF, and the like are pre-stored into the calibration file. Herein, 1112 represents the identification information of the measurement pin group and 10 pF represents the first capacitance value. Therefore, the target first capacitance value 10 pF may be obtained according to the identification information 1112 of the target measurement pin group.

At S45, for each of the multiple semiconductor devices, a respective target capacitance value is determined based on the respective target first capacitance value and a second capacitance value corresponding to the semiconductor device.

Here, the target capacitance value of the semiconductor device may include, but not limited to, the difference value between the second capacitance value and the first capacitance value, the difference value between the weighted second capacitance value and the weighted first capacitance value, and the like. During implementation, those skilled in the art may determine a manner of determining the target capacitance value according to the actual requirements, which is not limited in the embodiments of the disclosure.

In some implementations, S45 includes S451 to S452.

At S451, a difference value between the second capacitance value corresponding to the semiconductor device and the respective target first capacitance value is determined.

At S452, the difference value is taken as the respective target capacitance value of the semiconductor device.

In the embodiments of the disclosure, the identification information of the target measurement pin group used for measuring the semiconductor device is first determined, then the first capacitance value matched with the identification information is accurately searched from the calibration file. Based on the first capacitance value and the second capacitance value, the target capacitance value of the semiconductor device can be obtained. In this way, the target first capacitance value is read directly from the calibration file, without the need for measuring the target first capacitance value by the measurement probe card through probe down. Not only the probe down frequency of the measurement probe card is reduced, saving the measurement time of the semiconductor device, but also the number of contact times between the measurement probe card and the metal pad of the measurement item is reduced, reducing the dirty loss of the measurement probe card and improving the accuracy of measurement results.

Figure 5A:
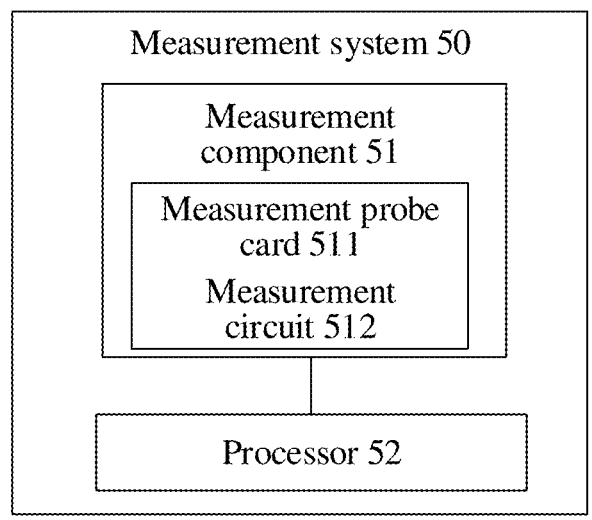
FIG. 5A illustrates a schematic structural diagram of composition of a measurement system according to embodiments of the disclosure.

FIG. 5A illustrates a schematic structural diagram of composition of a measurement system according to embodiments of the disclosure. As illustrated in FIG. 5A, the measurement system 50 includes a measurement component 51 and a processor 52.

The measurement component 51 includes a measurement probe card 511 and a measurement circuit 512. The measurement circuit 512 is configured to use the measurement probe card 511 to measure multiple semiconductor devices to obtain a second capacitance value of each of the multiple semiconductor devices.

The processor 52 is configured to: obtain a calibration file. The calibration file includes multiple first capacitance values corresponding to the measurement probe card 511 while the measurement probe card is floating. The processor 52 is configured to control the measurement circuit to measure, by the measurement probe card 511, the multiple semiconductor devices simultaneously to obtain multiple second capacitance values corresponding to the multiple semiconductor devices. The multiple semiconductor devices are located on a same test module of a semiconductor chip. The processor 52 is configured to determine target capacitance values of the multiple semiconductor devices based on the multiple first capacitance values and the multiple second capacitance values.

Here, the measurement circuit may include, but not limited to, a capacitance measurement apparatus, a device including the capacitance measurement apparatus, and the like. Herein, the capacitance measurement apparatus may be formed by voltage, resistance and a charge and discharge circuit.

In some implementations, the measurement component 51 further includes a base. The base is configured to bear a wafer. The wafer includes at least one semiconductor chip. The measurement probe card 511 includes multiple measurement pins. The processor 52 is further configured to control the base to move upwards before controlling the measurement circuit 512 to measure the multiple semiconductor devices, so as to enable each of the multiple measurement pins to be connected to a measurement port of a respective semiconductor device. The measurement circuit 512 is further configured to: for each of the multiple measurement pins, when the measurement pin is connected to the measurement port of the respective semiconductor device, enable the measurement pin to measure the respective semiconductor device to obtain the respective second capacitance value.

In some implementations, the measurement probe card 511 includes multiple measurement pins, and the multiple measurement pins include multiple measurement pin groups. The measurement circuit 512 is further configured to measure a first capacitance value between each of the multiple measurement pin groups. The processor 52 is further configured to control the measurement circuit 512 to measure, by a first measurement algorithm, multiple first capacitance values each between a respective one of the multiple measurement pin groups, and store the multiple first capacitance values into the calibration file.

In some implementations, the measurement component 51 further includes a base. The base is configured to bear a wafer. The wafer includes at least one semiconductor chip. The processor 52 is further configured to control the base to move downwards before controlling the measurement circuit 512 to measure the multiple first capacitance values each between a respective one of the multiple measurement pin groups, so as to enable the multiple measurement pin groups to float. The measurement circuit 512 is further configured to measure, by the first measurement algorithm, the multiple first capacitance values each between a respective one of the multiple measurement pin groups when the multiple measurement pin groups are floating.

In some implementations, the measurement probe card 511 includes multiple measurement pins. The processor 52 is further configured to: extract a measurement file and a measurement item; extract, from the measurement file, a first measurement algorithm corresponding to the measurement item; measure multiple first capacitance values between the multiple measurement pins based on the first measurement algorithm; and store the multiple first capacitance values into the calibration file, and update a preset identification bit to a second status value.

In some implementations, the processor 52 is further configured to: in response to obtaining a new batch of wafers, set the preset identification bit to a first status value, and delete the calibration file. Each wafer includes at least one semiconductor chip.

Figure 5B:
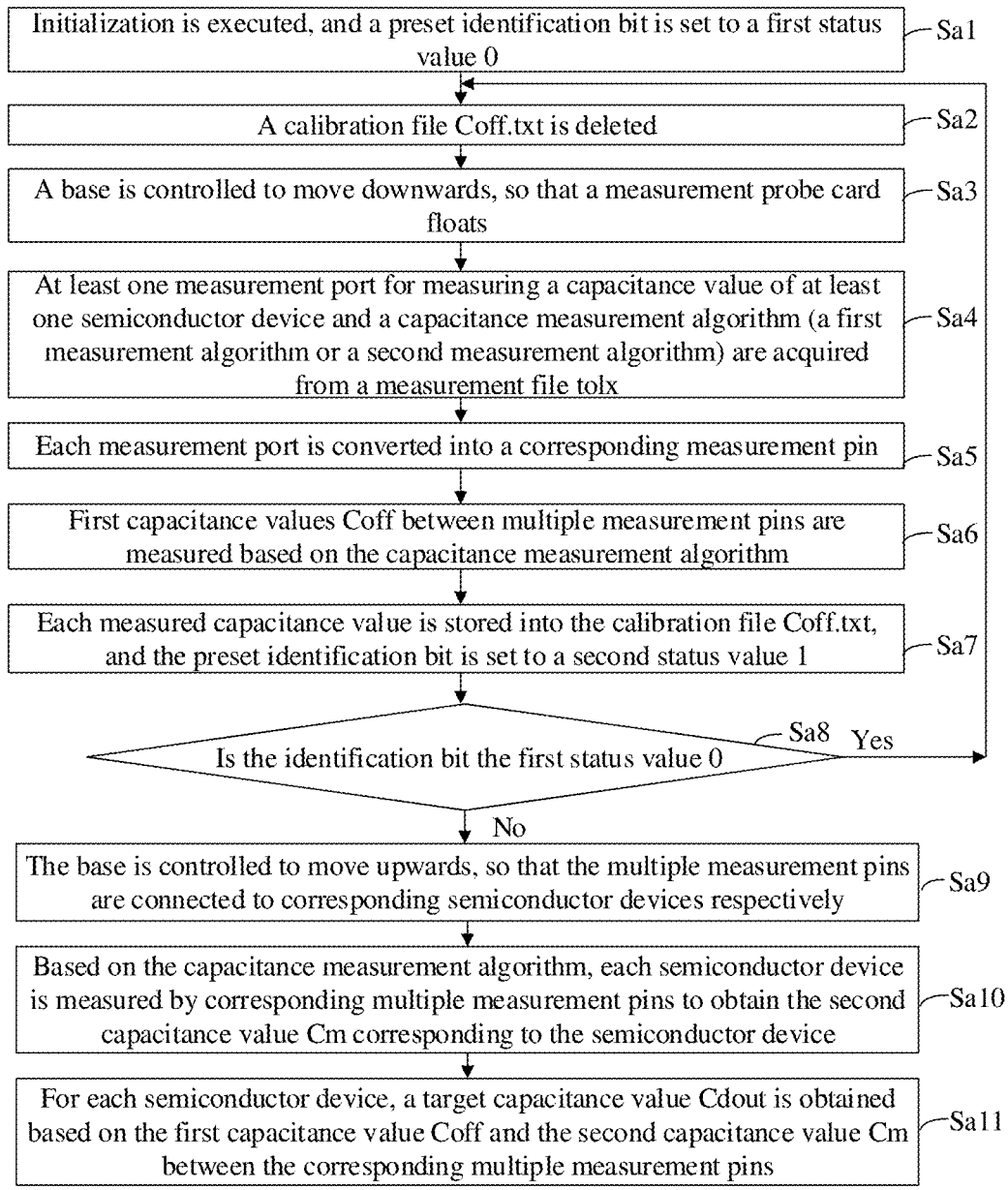
FIG. 5B illustrates a schematic diagram of an execution process of a processor according to embodiments of the disclosure.

FIG. 5B illustrates a schematic diagram of an execution process of a processor according to embodiments of the disclosure. As illustrated in FIG. 5B, the execution process of the processor includes the following steps.

At Sa1, initialization is executed, and a preset identification bit is set to a first status value 0.

At Sa2, a calibration file Coff.txt is deleted.

At Sa3, a base is controlled to move downwards, so that a measurement probe card floats.

At Sa4, at least one measurement port for measuring a capacitance value of at least one semiconductor device and a capacitance measurement algorithm (the first measurement algorithm or the second measurement algorithm) are acquired from the measurement file tolx.

At Sa5, each measurement port is converted into a corresponding measurement pin.

At Sa6, first capacitance values Coff between multiple measurement pins are measured based on the capacitance measurement algorithm.

At Sa1, each measured capacitance value is stored into a calibration file Coff.txt, and the preset identification bit is set to a second status value 1.

At Sa8, whether the identification bit is the first status value 0 is determined. If yes, Sa2 is returned. If not, Sa9 is executed.

At Sa9, the base is controlled to move upwards, so that the multiple measurement pins are connected to corresponding semiconductor devices respectively.

At Sa10, based on the capacitance measurement algorithm, each semiconductor device is measured by corresponding multiple measurement pins to obtain the second capacitance value Cm corresponding to the semiconductor device.

At Sa11, for each semiconductor device, a target capacitance value Cdout is obtained based on the first capacitance value Coff and the second capacitance value Cm between the corresponding multiple measurement pins.

Figure 5C:
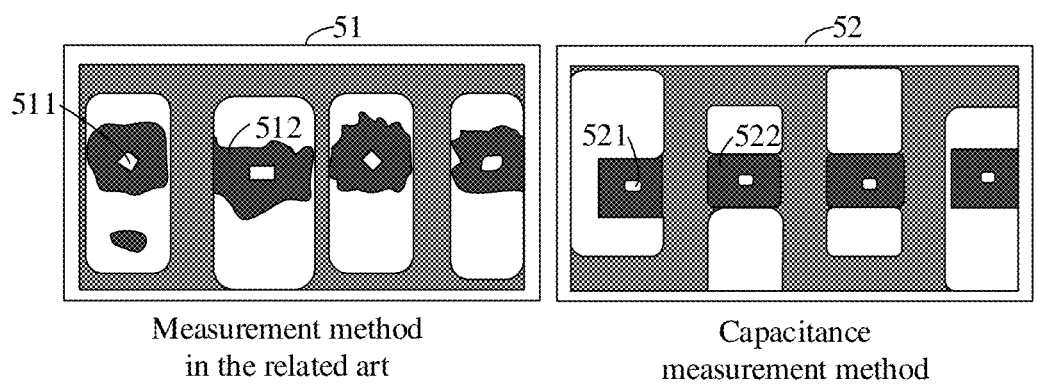
FIG. 5C illustrates a schematic diagram comparing a measurement probe card after measurement through a measurement method in the related art to a measurement probe card after measurement through a capacitance measurement method according to embodiments of the disclosure.

FIG. 5C illustrates a schematic diagram comparing a measurement probe card 51 after measurement through a measurement method in the related art to a measurement probe card 52 after measurement through a capacitance measurement method according to embodiments of the disclosure. As illustrated in FIG. 5C, when the measurement method in the related art is adopted, due to continuous probe up and down, a pin point 511 and a pin seat 512 are polluted. When the capacitance measurement method provided in the embodiment of the disclosure is adopted, the number of probe down times is greatly reduced, so that the pin point 521 and the pin seat 522 are basically not polluted.

Figure 5D:
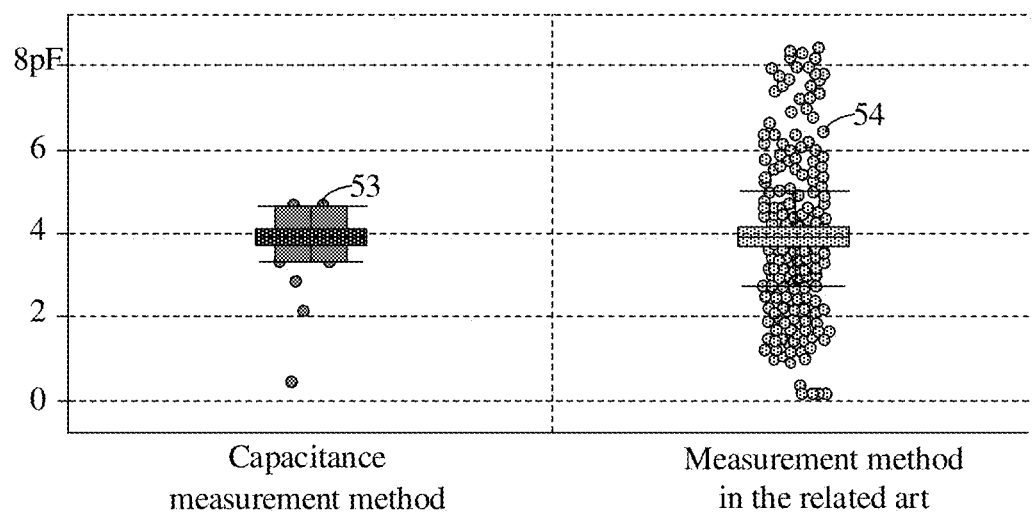
FIG. 5D illustrates a schematic diagram comparing capacitance values measured through a measurement method in the related art to capacitance values measured through a capacitance measurement method according to embodiments of the disclosure.

FIG. 5D illustrates a schematic diagram comparing capacitance values measured through a measurement method in the related art to capacitance values measured through a capacitance measurement method according to embodiments of the disclosure. As illustrated in FIG. 5D, due to continuous probe up and down, the capacitance value 54 obtained by adopting the measurement method in the related art has a large floating range, which means that the measurement result is very unstable. The capacitance value 53 obtained by the capacitance measurement method provided in the embodiment of the disclosure basically floats in a small range, which means that measurement result is very stable.

In the embodiments of the disclosure, the processor directly reads the first capacitance values from the calibration file without controlling the measurement circuit to measure the first capacitance values. On the one hand, the probe down frequency of the measurement probe card can be reduced, saving the measurement time of the semiconductor device and improving the measurement efficiency. On the other hand, the number of contact times between the measurement probe card and the metal pad of the measurement item can be reduced, thereby reducing the dirty loss of the measurement probe card and improving the accuracy of the measurement results.

Figure 6:
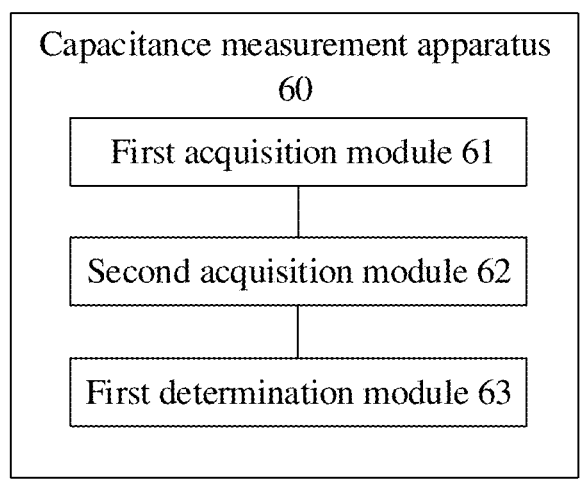
FIG. 6 illustrates a schematic structural diagram of composition of a capacitance measurement apparatus according to embodiments of the disclosure.

FIG. 6 illustrates a schematic structural diagram of composition of a capacitance measurement apparatus according to embodiments of the disclosure. The capacitance measurement apparatus is applied to a machine table. As illustrated in FIG. 6, the capacitance measurement apparatus 60 includes a first acquisition module 61, a second acquisition module 62 and a first determination module 63.

The first acquisition module 61 is configured to obtain a calibration file. The calibration file includes multiple first capacitance values corresponding to a measurement probe card while the measurement probe card is floating.

The second acquisition module 62 is configured to measure, by the measurement probe card, multiple semiconductor devices simultaneously to obtain multiple second capacitance values corresponding to the multiple semiconductor devices. The multiple semiconductor devices are located on a same test module of a semiconductor chip.

The first determination module 63 is configured to determine target capacitance values of the multiple semiconductor devices based on the multiple first capacitance values and the multiple second capacitance values.

In some implementations, the measurement probe card includes multiple measurement pins. The first acquisition module 61 is configured to: extract a measurement file and a measurement item; extract, from the measurement file, a first measurement algorithm corresponding to the measurement item; measure the multiple first capacitance values between the multiple measurement pins based on the first measurement algorithm; and store the multiple first capacitance values into the calibration file, and update a preset identification bit to a second status value.

In some implementations, the apparatus further includes an initialization module, configured to: in response to obtaining a new batch of wafers, set the preset identification bit to a first status value, and delete the calibration file. Each wafer includes at least one semiconductor chip.

In some implementations, the first acquisition module 61 is further configured to: determine measurement ports of the multiple semiconductor devices based on the measurement file; determine, based on each of the measurement ports, a respective measurement pin; and obtain, based on the first measurement algorithm, the multiple first capacitance values between the multiple measurement pins each of which is floating.

In some implementations, the multiple measurement pins include multiple measurement pin groups, and each measurement pin group includes a first pin and a second pin. The first acquisition module 61 is further configured to: for each measurement pin group, determine a quantity of electric charges between the first pin and the second pin of the measurement pin group; determine a voltage difference between the first pin and the second pin of the measurement pin group; and determine a first capacitance value of the measurement pin group based on the quantity of electric charges and the voltage difference.

In some implementations, the first acquisition module 61 is further configured to: for each of the multiple first capacitance values, determine capacitance identification information of the first capacitance value based on identification information of the first pin and identification information of the second pin by which the first capacitance value is measured; and store each piece of the capacitance identification information and a corresponding first capacitance value into the calibration file.

In some implementations, the measurement probe card includes multiple measurement pins. The second acquisition module 62 is further configured to: extract a measurement file and a measurement item; extract, from the measurement file, a second measurement algorithm corresponding to the measurement item; and measure, by the multiple measurement pins based on the second measurement algorithm, the multiple semiconductor devices simultaneously to obtain the multiple second capacitance values corresponding to the multiple semiconductor devices. Each of the multiple measurement pins is connected to a measurement port of a corresponding one of the multiple semiconductor devices.

In some implementations, the measurement probe card includes multiple measurement pins, and the multiple measurement pins include multiple measurement pin groups. The first determination module 63 is further configured to: for each of the multiple semiconductor devices, determine a respective target measurement pin group for measuring the semiconductor device, the respective target measurement pin group having identification information; for each of the multiple semiconductor devices, determine a respective target first capacitance value from the multiple first capacitance values based on the identification information of the respective target measurement pin group; and for each of the multiple semiconductor devices, determine a respective target capacitance value based on the respective target first capacitance value and a second capacitance value corresponding to the semiconductor device.

In some implementations, the first determination module 63 is further configured to: determine a difference value between the second capacitance value corresponding to the semiconductor device and the respective target first capacitance value; and take the difference value as the respective target capacitance value of the semiconductor device.

The descriptions about the above apparatus embodiment are similar to those about the method embodiment, and beneficial effects similar to those of the method embodiment are achieved. Technical details undisclosed in the apparatus embodiment of the disclosure may be understood with reference to the descriptions about the method embodiment of the disclosure.

It is to be noted that, in the embodiments of the disclosure, the method may be stored in a computer-readable storage medium when being implemented in form of a software function module and sold or used as an independent product. Based on such an understanding, the technical solutions of the embodiments of the disclosure substantially or parts making contributions to the related art may be embodied in form of a software product. The software product is stored in a storage medium, including multiple instructions for enabling a device (which may be a personal computer, a server, a network device, or the like) to execute all or part of the method in each embodiment of the disclosure. The storage medium includes various media capable of storing program codes, such as a USB flash disk, a mobile hard disk, a Read Only Memory (ROM), a magnetic disk, or an optical disk. Therefore, the embodiments of the disclosure are not limited to any specific combination of hardware and software.

Embodiments of the disclosure provide an electronic device, which includes a memory and a processor. The memory stores a computer program executable on the processor. The processor, when executing the computer program, implements the above method.

An embodiment of the disclosure provides a computer-readable storage medium having stored thereon a computer program that, when executed by a processor, enables the processor to implement the above method. The computer-readable storage medium may be transitory or non-transitory.

Embodiments of the disclosure provide a computer program product. The computer program product includes a non-transitory computer-readable storage medium storing a computer program that, when read and executed by a computer, enables the computer to implement some or all of steps in the above method are implemented. The computer program product may be specifically implemented in a manner of hardware, software or a combination thereof. In an optional embodiment, the computer program product is specifically embodied as a computer storage medium. In another optional embodiment, the computer program product is specifically embodied as a software product, such as a Software Development Kit (SDK).

Figure 7:
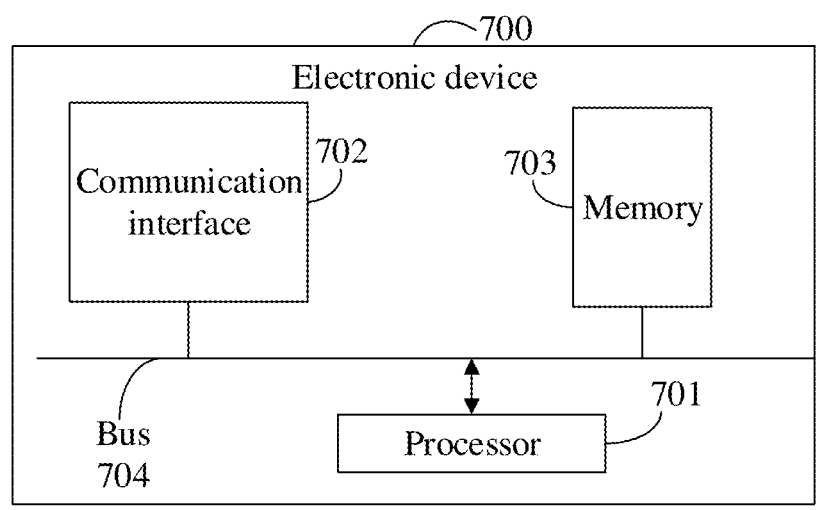
FIG. 7 illustrates a schematic diagram of a hardware entity of an electronic device according to embodiments of the disclosure.

It is to be noted that, FIG. 7 illustrates a schematic diagram of a hardware entity of an electronic device according to embodiments of the disclosure. As illustrated in FIG. 7, a hardware entity of the electronic device 700 includes a processor 701, a communication interface 702, and a memory 703.

The processor 701 usually controls an overall operation of the electronic device 700.

The communication interface 702 may enable the electronic device to communicate other terminals or servers through a network.

The memory 703 is configured to store instructions and an application executable by the processor 701, or may further cache data to be processed or processed by the processor 701 and each module in the electronic device 700 (such as, image data, audio data, voice communication data, and video communication data), which may be implemented by use of FLASH or a Random Access Memory (RAM). Data transmission among the processor 701, the communication interface 702, and the memory 703 may be achieved by through buses 704.

It is to be pointed out here that the above descriptions about the storage medium and device embodiments are similar to descriptions about the method embodiments and beneficial effects similar to those of the method embodiments are achieved. Technical details undisclosed in the storage medium and device embodiments of the disclosure may be understood with reference to the descriptions about the method embodiments of the disclosure.

It is to be understood that "one embodiment" or "an embodiment" mentioned in the whole specification means that specific features, structures or characteristics related to the embodiment is included in at least one embodiment of the disclosure. Therefore, "in one embodiment" or "in an embodiment" mentioned throughout the specification does not necessarily refer to the same embodiment. In addition, these specific features, structures or characteristics may be combined in one or more embodiments in any proper manner. It is to be understood that, in various embodiments of the disclosure, the magnitude of the sequence number of processes does not mean an execution sequence, and the execution sequence of these processes is determined by their functions and internal logics, and does not form any limitation to the implementation of the embodiments of the disclosure. The sequence numbers of the embodiments of the disclosure are only for description and do not represent superiority or inferiority of the embodiments.

It is to be noted that terms "comprise", "include" and "contain" or any other variation thereof are intended to cover nonexclusive inclusions herein, so that a process, method, object, or device including a series of elements not only includes those elements but also includes other elements which are not clearly listed, or further includes elements intrinsic to the process, the method, the object, or the device. Without more restrictions, an element defined by statement "including a/an . . . " does not exclude the existence of the same other elements in a process, method, object, or device besides the element.

In some embodiments provided in the disclosure, it is to be understood that the disclosed device and method may be implemented in other ways. The device embodiment described above is only schematic. For example, the division of units is only division in logic functions, and other division manners may be used during practical implementation. For example, multiple units or components may be combined or integrated into another system, or some features may be neglected or not executed. In addition, coupling or direct coupling or communication connection between displayed or discussed components may be indirect coupling or communication connection, implemented through some interfaces, device or units, and may be electrical and mechanical or in other forms.

The units described as separate parts may or may not be physically separated, and parts displayed as units may or may not be physical units. Namely, the units may be located in the same place, or may also be distributed to multiple network units. Part or all of the units may be selected as practically required to achieve the objectives of the solutions of the embodiments.

In addition, function units in various embodiments of the disclosure may be integrated into a processing unit. Alternatively, each unit may serve as an independent unit. Alternatively, two or more units may be integrated into a unit. The integrated unit may be implemented in a hardware form, or may be implemented in form of hardware plus a software function unit.

Those of ordinary skill in the art should know that all or some of the steps of the method embodiment may be implemented by related hardware instructed through a program. The program may be stored in a computer-readable storage medium. When the program is executed, the steps of the method embodiment are executed. The storage medium includes various media capable of storing program codes, such as a mobile storage device, a ROM, a magnetic disk, or an optical disk.

Alternatively, the integrated unit of the disclosure may be stored in a computer-readable storage medium when being implemented in form of a software function module and sold or used as an independent product. Based on such an understanding, the technical solutions of the disclosure substantially or parts making contributions to the related art may be embodied in form of a software product. The computer software product is stored in a storage medium, including multiple instructions for enabling an electronic device (which may be a personal computer, a server, a network device, or the like) to execute all or part of the method in each embodiment of the disclosure. The storage medium includes various media capable of storing program codes, such as a mobile hard disk, a ROM, a magnetic disk, or an optical disk.

The above are only the implementations of the disclosure and not intended to limit the scope of protection of the disclosure. Any variations or replacements apparent to those skilled in the art within the technical scope disclosed in the disclosure shall fall within the scope of protection of the disclosure.

INDUSTRIAL APPLICABILITY

In the embodiments of the disclosure, the first capacitance values corresponding to the measurement probe card while the measurement probe card is floating are obtained by the calibration file, the second capacitance values of the semiconductor devices are measured by the measurement probe card, and the target capacitance values of the semiconductor devices can be obtained based on the first capacitance values and the second capacitance values. In this way, the first capacitance values are read directly from the calibration file, without the need for measuring the first capacitance values through frequent probe-down of the measurement probe card. On the one hand, the probe-down frequency of the measurement probe card can be reduced, the measurement time of the semiconductor devices can be saved and the measurement efficiency can be improved. On the other hand, the number of contact times between the measurement probe card and the metal pad of the measurement item can be reduced, reducing the dirty loss of the measurement probe card, and improving the accuracy of the measurement results.

The invention claimed is:

1. A capacitance measurement method, applied to a machine table and comprising:
    obtaining a calibration file, wherein the calibration file comprises a plurality of first capacitance values corresponding to a measurement probe card while the measurement probe card is floating;
    measuring, by the measurement probe card, a plurality of semiconductor devices simultaneously to obtain a plurality of second capacitance values corresponding to the plurality of semiconductor devices, the plurality of semiconductor devices being located on a same test module of a semiconductor chip; and
    determining target capacitance values of the plurality of semiconductor devices based on the plurality of first capacitance values and the plurality of second capacitance values.

2. The method of claim 1, wherein the measurement probe card comprises a plurality of measurement pins, and obtaining the calibration file comprises:
    extracting a measurement file and a measurement item;
    extracting, from the measurement file, a first measurement algorithm corresponding to the measurement item;
    measuring the plurality of first capacitance values between the plurality of measurement pins based on the first measurement algorithm; and
    storing the plurality of first capacitance values into the calibration file, and updating a preset identification bit to a second status value.

3. The method of claim 2, wherein before extracting the measurement file and the measurement item, the method further comprises:
    in response to obtaining a new batch of wafers, setting the preset identification bit to a first status value, and deleting the calibration file, wherein each wafer comprises at least one semiconductor chip.

4. The method of claim 2, wherein measuring the plurality of first capacitances value between the plurality of measurement pins based on the first measurement algorithm comprises:
    determining measurement ports of the plurality of semiconductor devices based on the measurement file;
    determining, based on each of the measurement ports, a respective measurement pin; and
    obtaining, based on the first measurement algorithm, the plurality of first capacitance values between the plurality of measurement pins each of which is floating.

5. The method of claim 4, wherein the plurality of measurement pins comprise a plurality of measurement pin groups, and each measurement pin group comprises a first pin and a second pin; and
    obtaining, based on the first measurement algorithm, the plurality of first capacitances value between the plurality of measurement pins comprises:
    for each measurement pin group, determining a quantity of electric charges between the first pin and the second pin of the measurement pin group;
    determining a voltage difference between the first pin and the second pin of the measurement pin group; and determining a first capacitance value of the measurement pin group based on the quantity of electric charges and the voltage difference.

6. The method of claim 5, wherein storing the plurality of first capacitance values into the calibration file comprises:
for each of the plurality of first capacitance values, determining capacitance identification information of the first capacitance value based on identification information of the first pin and identification information of the second pin by which the first capacitance value is measured; and
storing each piece of the capacitance identification information and a corresponding first capacitance value into the calibration file.

7. The method of claim 1, wherein the measurement probe card comprises a plurality of measurement pins; and
measuring, by the measurement probe card, the plurality of semiconductor devices simultaneously to obtain the plurality of second capacitance values corresponding to the plurality of semiconductor devices comprises:
extracting a measurement file and a measurement item;
extracting, from the measurement file, a second measurement algorithm corresponding to the measurement item; and
measuring, by the plurality of measurement pins based on the second measurement algorithm, the plurality of semiconductor devices simultaneously to obtain the plurality of second capacitance values corresponding to the plurality of semiconductor devices, wherein each of the plurality of measurement pins is connected to a measurement port of a corresponding one of the plurality of semiconductor devices.

8. The method of claim 1, wherein the measurement probe card comprises a plurality of measurement pins, and the plurality of measurement pins comprise a plurality of measurement pin groups;
determining the target capacitance values of the plurality of semiconductor devices based on the plurality of first capacitance values and the plurality of second capacitance values comprises:
for each of the plurality of semiconductor devices, determining a respective target measurement pin group for measuring the semiconductor device, the respective target measurement pin group having identification information;
for each of the plurality of semiconductor devices, determining a respective target first capacitance value from the plurality of first capacitance values based on the identification information of the respective target measurement pin group; and
for each of the plurality of semiconductor devices, determining a respective target capacitance value based on the respective target first capacitance value and a second capacitance value corresponding to the semiconductor device.

9. The method of claim 8, wherein for each of the plurality of semiconductor devices, determining the respective target capacitance value based on the respective target first capacitance value and the second capacitance value corresponding to the semiconductor device comprises:
determining a difference value between the second capacitance value corresponding to the semiconductor device and the respective target first capacitance value; and
taking the difference value as the respective target capacitance value of the semiconductor device.

10. A measurement system, comprising:
a measurement component comprising a measurement probe card and a measurement circuit, wherein the measurement circuit is configured to use the measurement probe card to measure a plurality of semiconductor devices to obtain a second capacitance value of each of the plurality of semiconductor devices; and
a processor, configured to: obtain a calibration file, wherein the calibration file comprises a plurality of first capacitance values corresponding to the measurement probe card while the measurement probe card is floating; control the measurement wafer circuit to measure, by the measurement probe card, the plurality of semiconductor devices simultaneously to obtain a plurality of second capacitance values corresponding to the plurality of semiconductor devices, wherein the plurality of semiconductor devices are located on a same test module of a semiconductor chip; and determine target capacitance values of the plurality of semiconductor devices based on the plurality of first capacitance values and the plurality of second capacitance values.

11. The system of claim 10, wherein the measurement component further comprises a base, the base is configured to bear a wafer, the wafer comprises at least one semiconductor chip, and the measurement probe card comprises a plurality of measurement pins;
the processor is further configured to: control the base to move upwards before controlling the measurement circuit to measure the plurality of semiconductor devices, so as to enable each of the plurality of measurement pins to be connected to a measurement port of a respective semiconductor device; and
the measurement circuit is further configured to: for each of the plurality of measurement pins, when the measurement pin is connected to the measurement port of the respective semiconductor device, enable the measurement pin to measure the respective semiconductor device to obtain the respective second capacitance value.

12. The system of claim 10, wherein the measurement probe card comprises a plurality of measurement pins, and the plurality of measurement pins comprise a plurality of measurement pin groups;
the measurement circuit is further configured to measure a first capacitance value between each of the plurality of measurement pin groups; and
the processor is further configured to control the measurement circuit to measure, by a first measurement algorithm, a plurality of first capacitance values each between a respective one of the plurality of measurement pin groups, and store the plurality of first capacitance values into the calibration file.

13. The system of claim 12, wherein the measurement component further comprises a base, the base is configured to bear a wafer, and the wafer comprises at least one semiconductor chip;
the processor is further configured to control the base to move downwards before controlling the measurement circuit to measure the plurality of first capacitance values each between a respective one of the plurality of measurement pin groups, so as to enable the plurality of measurement pin groups to float; and
the measurement circuit is further configured to measure, by the first measurement algorithm, the plurality of first capacitance values each between a respective one of the plurality of measurement pin groups when the plurality of measurement pin groups are floating.

14. The system of claim 10, wherein the measurement probe card comprises a plurality of measurement pins, and the processor is further configured to:
- extract a measurement file and a measurement item;
- extract, from the measurement file, a first measurement algorithm corresponding to the measurement item;
- measure a plurality of first capacitance values between the plurality of measurement pins based on the first measurement algorithm; and
- store the plurality of first capacitance values into the calibration file, and update a preset identification bit to a second status value.

15. The system of claim 14, wherein the processor is further configured to:
- in response to obtaining a new batch of wafers, set the preset identification bit to a first status value, and delete the calibration file, wherein each wafer comprises at least one semiconductor chip.

16. A capacitance measurement apparatus, applied to a machine table and comprising a processor and a memory having stored thereon a computer program executable on the processor, wherein the processor, when executing the computer program, implements a capacitance measurement method, the method comprising:
- obtaining a calibration file, wherein the calibration file comprises a plurality of first capacitance values corresponding to a measurement probe card while the measurement probe card is floating;
- measuring, by the measurement probe card, a plurality of semiconductor devices simultaneously to obtain a plurality of second capacitance values corresponding to the plurality of semiconductor devices, the plurality of semiconductor devices being located on a same test module of a semiconductor chip; and
- determining target capacitance values of the plurality of semiconductor devices based on the plurality of first capacitance values and the plurality of second capacitance values.

17. The capacitance measurement apparatus of claim 16, wherein the measurement probe card comprises a plurality of measurement pins, and obtaining the calibration file comprises:
- extracting a measurement file and a measurement item;
- extracting, from the measurement file, a first measurement algorithm corresponding to the measurement item;
- measuring the plurality of first capacitance values between the plurality of measurement pins based on the first measurement algorithm; and
- storing the plurality of first capacitance values into the calibration file, and updating a preset identification bit to a second status value.

18. The capacitance measurement apparatus of claim 16, wherein the measurement probe card comprises a plurality of measurement pins; and
- measuring, by the measurement probe card, the plurality of semiconductor devices simultaneously to obtain the plurality of second capacitance values corresponding to the plurality of semiconductor devices comprises:
- extracting a measurement file and a measurement item;
- extracting, from the measurement file, a second measurement algorithm corresponding to the measurement item; and
- measuring, by the plurality of measurement pins based on the second measurement algorithm, the plurality of semiconductor devices simultaneously to obtain the plurality of second capacitance values corresponding to the plurality of semiconductor devices, wherein each of the plurality of measurement pins is connected to a measurement port of a corresponding one of the plurality of semiconductor devices.

19. The capacitance measurement apparatus of claim 16, wherein the measurement probe card comprises a plurality of measurement pins, and the plurality of measurement pins comprise a plurality of measurement pin groups;
- determining the target capacitance values of the plurality of semiconductor devices based on the plurality of first capacitance values and the plurality of second capacitance values comprises:
- for each of the plurality of semiconductor devices, determining a respective target measurement pin group for measuring the semiconductor device, the respective target measurement pin group having identification information;
- for each of the plurality of semiconductor devices, determining a respective target first capacitance value from the plurality of first capacitance values based on the identification information of the respective target measurement pin group; and
- for each of the plurality of semiconductor devices, determining a respective target capacitance value based on the respective target first capacitance value and a second capacitance value corresponding to the semiconductor device.

20. A non-transitory computer-readable storage medium having stored thereon a computer program that, when executed by a processor, implements the method of claim 1.

* * * * *